US006995071B2

(12) United States Patent
Oh et al.

(10) Patent No.: US 6,995,071 B2
(45) Date of Patent: Feb. 7, 2006

(54) METHODS OF FORMING MIM TYPE CAPACITOR STRUCTURES USING LOW TEMPERATURE PLASMA PROCESSING

(75) Inventors: Se-hoon Oh, Gyeonggi-do (KR); Jung-hee Chung, Seoul (KR); Jae-hyoung Choi, Gyeonggi-do (KR); Jeong-sik Choi, Seoul (KR); Sung-tae Kim, Seoul (KR); Cha-young Yoo, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/830,214

(22) Filed: Apr. 22, 2004

(65) Prior Publication Data

US 2004/0248361 A1    Dec. 9, 2004

(30) Foreign Application Priority Data

May 9, 2003    (KR) ...................... 10-2003-0029368

(51) Int. Cl.
*H10L 21/8242*    (2006.01)
(52) U.S. Cl. ...................... 438/396; 438/240; 438/253; 438/785; 438/957
(58) Field of Classification Search ................ 438/210, 438/239, 240, 253, 396, 648, 650, 685, 785, 438/FOR. 220, FOR. 430, 957
See application file for complete search history.

(56) References Cited

U.S. PATENT DOCUMENTS

| 5,374,578 A | * | 12/1994 | Patel et al. ................... 438/3 |
| 5,440,157 A | * | 8/1995 | Imai et al. ................... 257/310 |
| 5,641,702 A | * | 6/1997 | Imai et al. ................... 438/396 |
| 6,063,639 A | | 5/2000 | Kim et al. ...................... 438/3 |
| 6,509,200 B2 | * | 1/2003 | Koyanagi ...................... 438/14 |
| 2002/0106536 A1 | * | 8/2002 | Lee et al. ................... 428/702 |
| 2002/0137239 A1 | * | 9/2002 | Koyanagi ...................... 438/16 |
| 2002/0190294 A1 | * | 12/2002 | Iizuka et al. ................ 257/296 |
| 2002/0195643 A1 | * | 12/2002 | Harada ....................... 257/310 |
| 2004/0009678 A1 | * | 1/2004 | Asai et al. ................... 438/785 |
| 2004/0011380 A1 | * | 1/2004 | Ji et al. ....................... 134/1.1 |
| 2004/0043569 A1 | * | 3/2004 | Ahn et al. ................... 438/287 |

FOREIGN PATENT DOCUMENTS

| KP | 1020010060981 | 7/2001 |
| KR | 1020000045296 | 7/2000 |
| KR | 1020010017212 | 3/2001 |
| KR | 10-2002-0034710 | 5/2002 |
| KR | 1020020034710 | 5/2002 |
| KR | 10-2003-0005021 | 1/2003 |

OTHER PUBLICATIONS

Notice to Submit a Response for Korean Patent Application No. 10-2003-0029368 mailed on Apr. 29, 2005.

* cited by examiner

*Primary Examiner*—George Fourson
*Assistant Examiner*—Joannie Adelle Garcia
(74) *Attorney, Agent, or Firm*—Myers Bigel Sibley & Sajovec

(57) ABSTRACT

Methods of forming metal-insulator-metal type capacitors in integrated circuit memory devices can include crystallizing an $HfO_2$ dielectric layer on a lower electrode of a capacitor structure in a low temperature plasma treatment at a temperature in range between about 250 degrees Centigrade and about 450 degrees Centigrade. An upper electrode can be formed on the $HfO_2$ dielectric layer.

15 Claims, 7 Drawing Sheets

METHODS OF FORMING MIM TYPE CAPACITOR STRUCTURES USING LOW TEMPERATURE PLASMA PROCESSING

CROSS-REFERENCE TO RELATED APPLICATION

This application claims priority to Korean Patent Application No. 2003-29368, filed on May 9, 2003, in the Korean Intellectual Property Office, the content of which is incorporated herein by reference in its entirety.

FIELD OF THE INVENTION

The invention relates to methods of manufacturing a capacitor of an integrated circuit, and more particularly, to methods of manufacturing metal-insulator-metal type capacitors.

BACKGROUND

As the density of integrated circuit (i.e., semiconductor) devices increases, the design rule associated therewith may decrease accordingly so that the area occupied, for example, by a memory cell in an integrated circuit memory device may be reduced. In a dynamic random access memory (DRAM), a capacitor in a memory cell may occupy a relatively small area but may still need some level of capacitance to allow data to be stored and retrieved. Accordingly, reductions in the margins associated with manufacturing of memory cells may influence the design of capacitors used in the respective memory cells.

It is known to employ a variety of 3-dimensional shapes for lower electrodes to reduce the size of capacitors so that a predetermined capacitance can be maintained. For example, it is known to form cylindrically shaped lower electrodes and capacitor-over-bit line (COB)-type cylindrically shaped lower electrodes along these lines.

Meanwhile, various techniques have been applied to increase capacitance per unit area. For example, some conventional metal-insulator-semiconductor (MIS) capacitors use a SiO2 dielectric layer, where the thickness of the dielectric layer is reduced, but the overall effective surface area of the electrode is increased by using a 3-dimensional structure. However, as the density of integrated circuit devices has increased, the use of SiO2 layers may reach some technical limit. It has been proposed to form MIM capacitors with electrodes of metals having a relatively large work function, such as TiN and Pt, to address the potential limits of the above approach (to MIS capacitors). In these types of MIM capacitors, a metal oxide having a high affinity for oxygen is usually used as a dielectric layer. For example, it is known to use a metal oxide of Ta2O5, Y2O3, HfO2, Nb2O5, TiO2, BaO, SrO, and BST, to form a dielectric layer of an MIM capacitor. It is also known to use $HfO_2$, which has a high dielectric constant (i.e., high-k) of about 20 to 25 and a high band gap, as a dielectric layer. Unlike other high-k dielectric layers, an $HfO_2$ layer may provide relatively good reliability and stability for dielectric materials in capacitors in integrated circuit memory devices.

In some conventional methods of forming a capacitor, a $HfO_2$ dielectric layer is formed on a lower electrode and thermally treated at a high temperature of about 550 degrees Centigrade or greater, to treat oxygen deficiencies or defects in the $HfO_2$ dielectric layer. However, a lower electrode may be oxidized during the high-temperature thermal process, which may result in reduced capacitance. Also, the thermal process may cause an increase in leakage current due to structural stress and an increase in contact resistance. Furthermore, if a capacitor dielectric layer in a highly integrated circuit memory device is thermally treated at a high temperature other structures, such as a transistor, may be seriously damaged.

Also, when an MIM capacitor is conventionally manufactured, an upper electrode may be formed using a Cl-containing source gas, such as $TiCl_4$. However, a MIM capacitor of this type, which also includes a $HfO_2$ dielectric layer, may have increased leakage current.

SUMMARY

Embodiments according to the invention can provide methods of forming metal-insulator-metal (MIM) type capacitor structures in integrated circuit memory devices using low temperature plasma processing. Pursuant to some embodiments according to the invention, a metal-insulator-metal type capacitor can be formed in an integrated circuit memory device by crystallizing an $HfO_2$ dielectric layer on a lower electrode of a capacitor structure in a low temperature plasma treatment at a temperature in range between about 250 degrees Centigrade and about 450 degrees Centigrade. An upper electrode is formed on the $HfO_2$ dielectric layer.

Low temperature plasma processing may enable the upper electrode to be formed without seriously degrading a lower structure (such as a lower electrode formed of a material that may be otherwise susceptible to high-temperature processing). Also, low temperature plasma processing may avoid or reduce leakage currents of the capacitor using the $HfO_2$ dielectric layer. Further, if an upper electrode is formed using a Cl-containing source, the dielectric characteristics of the $HfO_2$ dielectric layer may remain adequate so that the leakage current characteristics may be acceptable, whereas the capacitance can be provided to the level needed to provide a functional memory cell.

In some embodiments according to the invention, the $HfO_2$ dielectric layer is crystallized in a range between about 350 degrees Centigrade and about 450 degrees Centigrade. In some embodiments according to the invention, the upper electrode is formed using a metal source containing halogen or an organometallic compound, or a combination thereof.

In some embodiments according to the invention, forming the upper electrode using a metal source further comprises forming the upper electrode using a metal source containing Cl. In some embodiments according to the invention, the $HfO_2$ layer 50 is crystallized in the low temperature plasma atmosphere including an N gas. In some embodiments according to the invention, the $HfO_2$ layer 50 is crystallized in the low temperature plasma atmosphere including $NH_3$ gas or $N_2O$ gas or $N_2$, gas or combinations thereof.

In some embodiments according to the invention, metal-insulator-metal type capacitor structures in an integrated circuit memory device are formed by forming a buried contact plug in a first interlayer dielectric layer on a substrate. A silicon nitride layer and a second interlayer dielectric layer are formed on the buried contact plug. A buffer buried contact plug is formed in the silicon nitride layer and in the second interlayer dielectric layer to contact the buried contact plug. A high density plasma layer, a silicon nitride layer, a protection layer, and an insulating layer are sequentially formed on the buffer buried contact plug to form a cover layer. A portion of the cover layer is removed to form a hole to expose at least a portion of the buffer buried contact plug.

A conductive layer is formed in the hole and outside the hole on the insulating layer using a Cl source metal. A sacrificial layer is formed on the conductive layer inside and outside the hole. A portion of the of the sacrificial layer outside the hole is removed to expose the insulating layer. The insulating layer is removed from around the conductive layer to form a lower electrode for the capacitor. An amorphous $HfO_2$ dielectric layer is formed on the lower electrode. The amorphous $HfO_2$ dielectric layer is crystallized on the lower electrode in a low temperature plasma atmosphere including $NH_3$ gas or $N_2O$ gas or $N_2$, gas or combinations thereof in temperature range between about 350 degrees Centigrade and about 450 degrees Centigrade to provide a crystallized $HfO_2$ dielectric layer. An upper electrode is formed on the crystallized $HfO_2$ dielectric layer using a halogen-containing metal source or an organometallic compound source or a combination thereof.

DETAILED DESCRIPTION OF EMBODIMENTS ACCORDING TO THE INVENTION

Figure 1A:
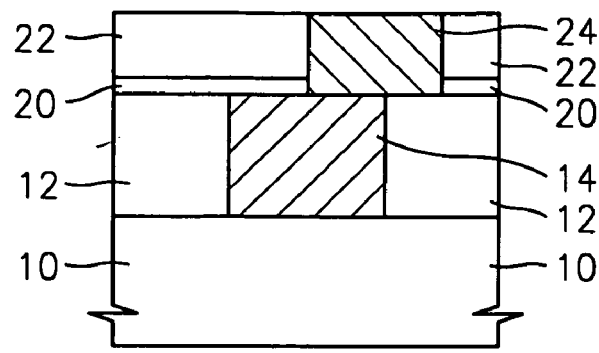
FIGS. 1A through 1I are cross-sectional views illustrating method embodiments of manufacturing capacitors in an integrated circuit memory device according to the invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. Furthermore, relative terms such as "lower" or "upper" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first region, layer or section discussed below could be termed a second region, layer or section, and, similarly, a second region, layer or section could be termed a first region, layer or section without departing from the teachings of the present invention.

Relative terms, such as "lower" and "upper", may be used herein to describe one elements relationship to another elements as illustrated in the Figures. It will be understood that relative terms are intended to encompass different orientations of the device in addition to the orientation depicted in the Figures. For example, if the device in the Figures is turned over, elements described as being on the "lower" of other elements would then be oriented on "upper" of the other elements. The exemplary term "lower", can therefore, encompasses both an orientation of lower and upper, depending of the particular orientation of the figure.

FIGS. 1A through 1I are cross-sectional views illustrating method embodiments of forming capacitors in an integrated circuit memory device according to the invention. Referring to FIG. 1A, a buried contact (BC) plug 14 is formed on an integrated circuit substrate 10 (such as a substrate) to penetrate a first interlayer dielectric (ILD) 12 and contact an active region of the substrate 10. A silicon nitride layer 20 and a second ILD 22 are formed on the first ILD 12 and the BC 14. A buffer BC plug 24 is formed to penetrate the silicon nitride layer 20 and the second ILD 22 to contact the BC plug 14.

Figure 1B:
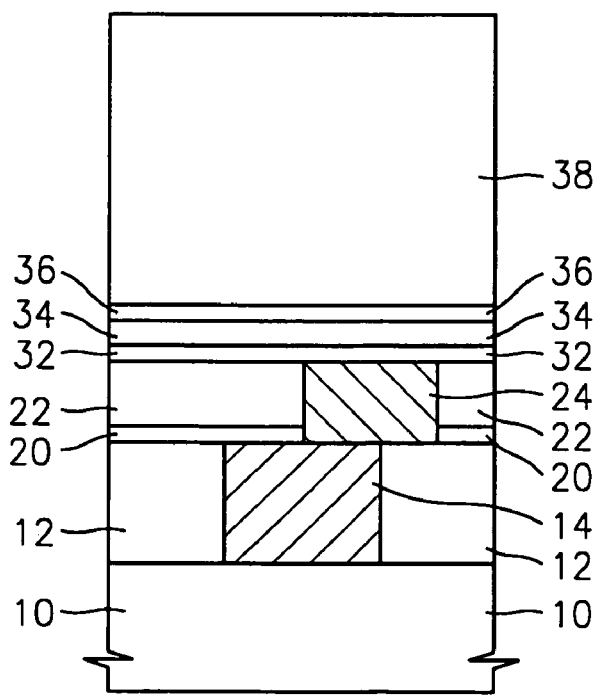

Referring to FIG. 1B, a high-density plasma (HDP) oxide layer 32, which will be used as an etch stop layer, and a silicon nitride layer 34 are formed on the buffer BC plug 24 and on the second ILD 22. A protection layer 36 is formed on the HDP oxide layer 32 and the silicon nitride layer 34 to protect the lower layers during a subsequent wet etch process. In some embodiments according to the invention, the protection layer 36 is formed of, for example, a tantalum oxide layer. An insulating layer 38 is formed on the protection layer 36 to provide a mold layer.

Figure 1C:
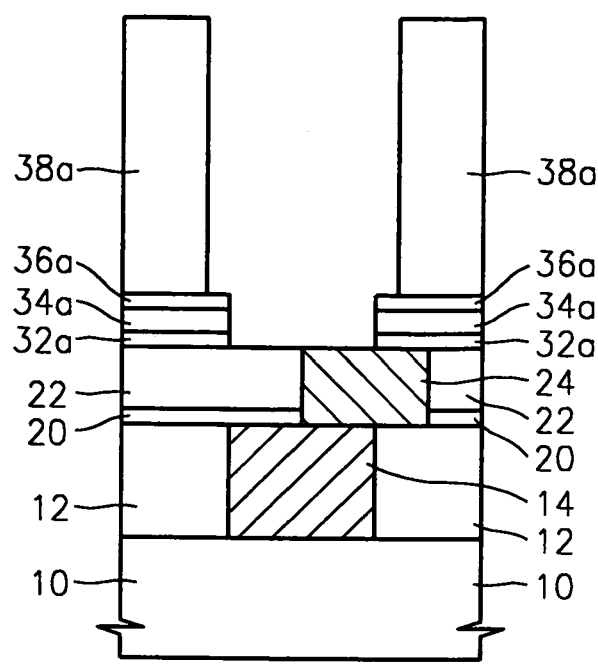

Referring to FIG. 1C, the insulating layer 38, the protection layer 36, the silicon nitride layer 34, and the HDP oxide layer 32 are sequentially patterned until the top surface of the buffer BC plug 24 is exposed. Thus, an HDP oxide pattern 32a, a silicon nitride pattern 34a, a protection pattern 36a, and an insulating pattern 38a collectively provide what is referred to as a mold layer used for formation of a lower electrode.

Figure 1D:
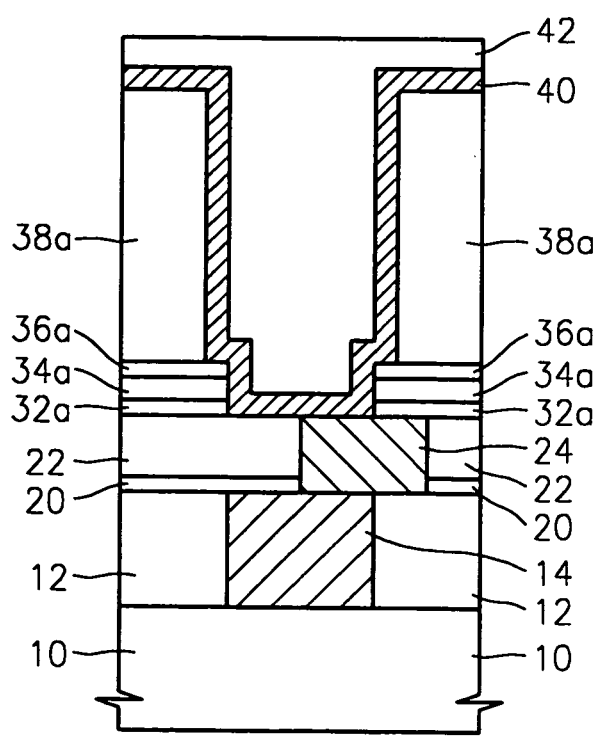

Referring to FIG. 1D, a conductive material is deposited to cover the exposed surface of the buffer BC plug 24 and the mold layer, thereby forming a conductive layer 40 for a lower electrode. In some embodiments according to the invention, the conductive layer 40 is formed of a metal nitride or a noble metal, such as, for example, TiN, TaN, WN, Ru, Ir, or Pt or combinations thereof. Other materials and combinations of materials can be used. In some embodiments according to the invention, the conductive layer 40 can be formed using atomic layer deposition (ALD), chemical vapor deposition (CVD), or metal-organic CVD (MOCVD). The conductive layer 40 is covered with a sacrificial insulating layer 42, which is formed of, for example, flowable oxide (FOX). In some embodiments according to the invention, the conductive layer 40 is completely covered by the sacrificial insulating layer 42.

Figure 1E:
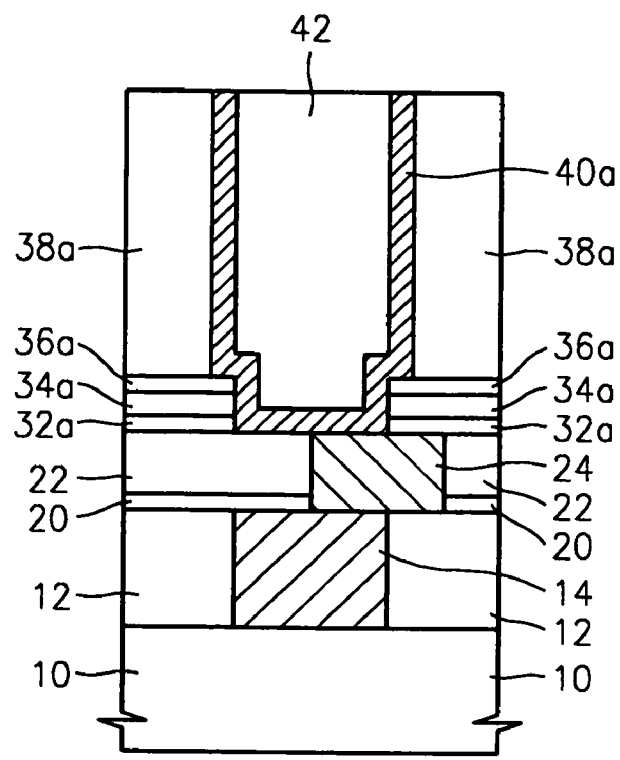

Referring to FIG. 1E, portions of the sacrificial insulating layer 42 and the conductive layer 40 are removed using a dry etch process or a planarization process, such as chemical mechanical polishing (CMP), until an upper surface of the insulating pattern 38a is exposed. The etch process can be used to separate the conductive layer 40 into separate lower electrodes 40a.

Figure 1F:
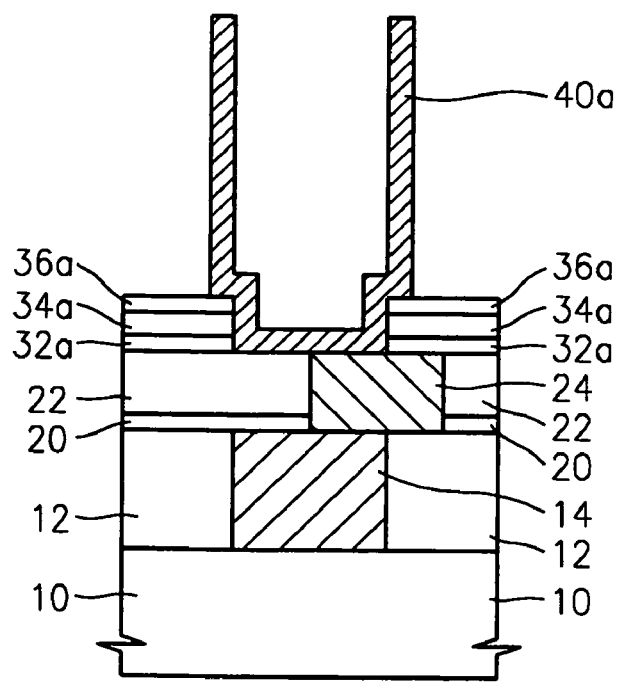

Referring to FIG. 1F, the insulating pattern 38a and the sacrificial insulating layer 42 are removed by a wet etch process using a commercially available LAL etchant, which is commercially available, for example, from Hashimoto Chemical Industry Co., Ltd, to form a one-cylinder-stack (OCS)-type lower electrode 40a.

Figure 1G:
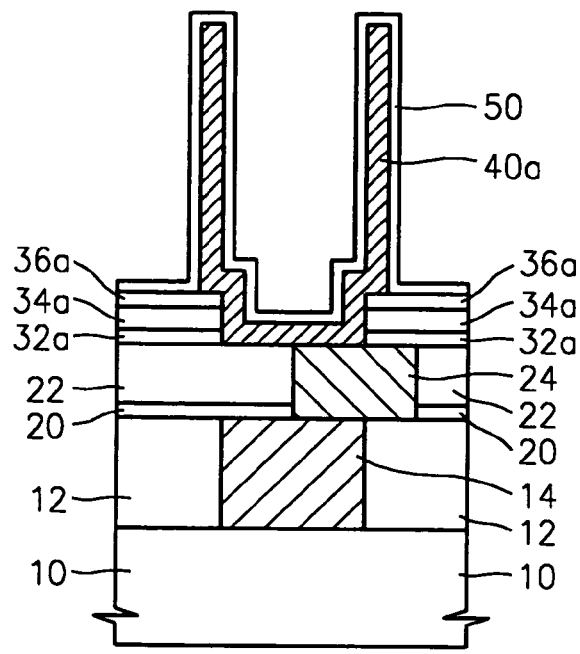

Referring to FIG. 1G, an amorphous $HfO_2$ layer 50 is formed on the lower electrode 40a. In some embodiments according to the invention, the $HfO_2$ layer 50 is formed using ALD, CVD, physical vapor deposition (PVD), MOCVD, or other processes. When the $HfO_2$ layer 50 is formed using CVD, for example, a deposition process is performed using a Hf source, such as $HfCl_4$, $Hf(OtBu)_4$, $Hf(NEtMe)_4$, $Hf(MMP)_4$, and $Hf(NMe_2)_4$, and an $O_2$ gas at a temperature in a range between about 400 degrees Centigrade and about 500 degrees Centigrade under a pressure in a range between about 1 Torr and about 5 Torr.

When the $HfO_2$ layer 50 is formed using ALD, an organometallic precursor, such as $HfCl_4$, $Hf(NO_3)_4$, $Hf(OtBu)_4$, $Hf(OtBu)_2(DMAE)_2$, $Hf(OtBu)_2(MMP)_2$, $Hf(OiPr)_2(THD)_2$, $Hf(OiPr)_3(THD)$, $Hf(NEtMe)_4$, $Hf(MMP)_4$, $Hf(NMe_2)_4$, $Hf(NEt_2)_4$, and $Hf[N(Me_2)(MEt)]_4$, can be used as an Hf source. It will be understood that DMAE refers to dimethylaminoethoxide ($OCH_2CH_2NMe_2$), MMP refers to methoxymethyl-2-propoxide ($OCMe_2CH_2OMe$), and THD refers to tetramethylheptanedionate ($Me_3CCoCHCOCMe_3$). In some embodiments according to the invention, the $O_2$ source can be $H_2O$, $O_3$, and/or $O_2$-plasma. Other sources can be used.

The deposition process is performed at a temperature in a range between about 250 degrees Centigrade and about 450 degrees Centigrade under a pressure in a range between about 1 Torr and about 5 Torr. The deposition process (and a purging process) are repeated until the $HfO_2$ layer is formed to a desired thickness. Using ALD to form the $HfO_2$ layer may enable low-temperature deposition having excellent step coverage with a controlled layer thickness.

Figure 1H:
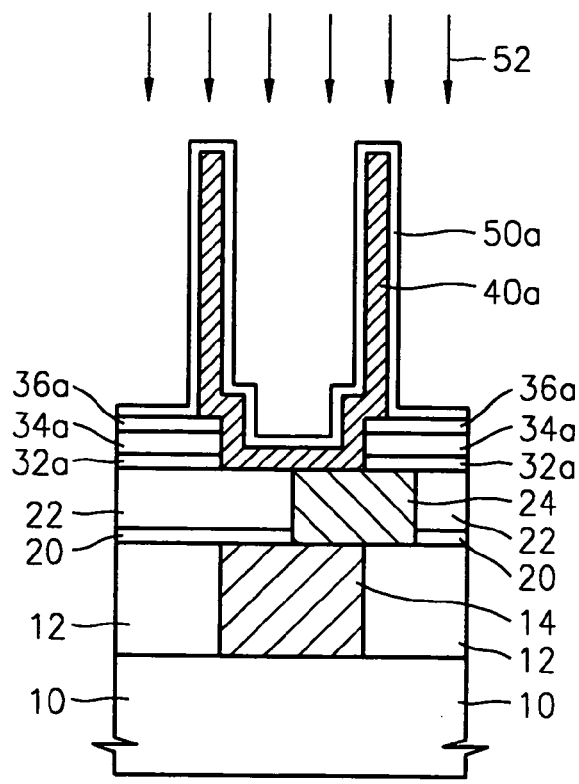

Referring to FIG. 1H, the $HfO_2$ layer 50 is crystallized using plasma (52) processing to form an $HfO_2$ dielectric layer 50a. In some embodiments according to the invention, the plasma (52) processing is preferably carried out at a relatively low temperature in a range between about 250 degrees Centigrade and about 450 degrees Centigrade. In some embodiments according to the invention, the plasma (52) processing is preferably carried out at a temperature in a range between about 350 degrees Centigrade and about 450 degrees Centigrade.

The plasma (52) processing for crystallizing the $HfO_2$ layer 50 is performed in a plasma atmosphere that includes an N gas. Preferably, the atmosphere includes $NH_3$, $N_2O$, $N_2$, or combinations thereof. By crystallizing the $HfO_2$ dielectric layer 50a using low-temperature plasma (52) processing, a dielectric layer may be formed by a low-temperature process, and the leakage current may be reduced.

Figure 1I:
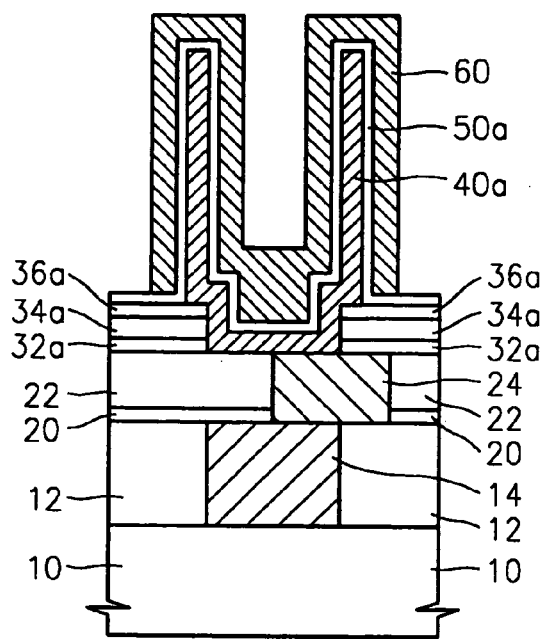

Referring to FIG. 1I, an upper electrode 60 is formed on the $HfO_2$ dielectric layer 50a. In some embodiments according to the invention, the upper electrode 60 is formed of a metal nitride or a noble metal. For example, the upper electrode 60 is formed of TiN, TaN, WN, Ru, Ir, Pt, or combinations thereof. Other materials and combinations thereof can be used.

In some embodiments according to the invention, the upper electrode 60 is formed using ALD, CVD, or MOCVD. Other processes can be used. Because the $HfO_2$ dielectric layer 50a is formed by the plasma (52) processing, even if the upper electrode 60 is formed using a source that contains Cl, the leakage current characteristics of the capacitor can remain adequate. Accordingly, when the upper electrode 60 is formed, a metal source containing a halogen, such as Cl, or an organometallic compound source may be used without seriously degrading the leakage current characteristics.

Figure 2:
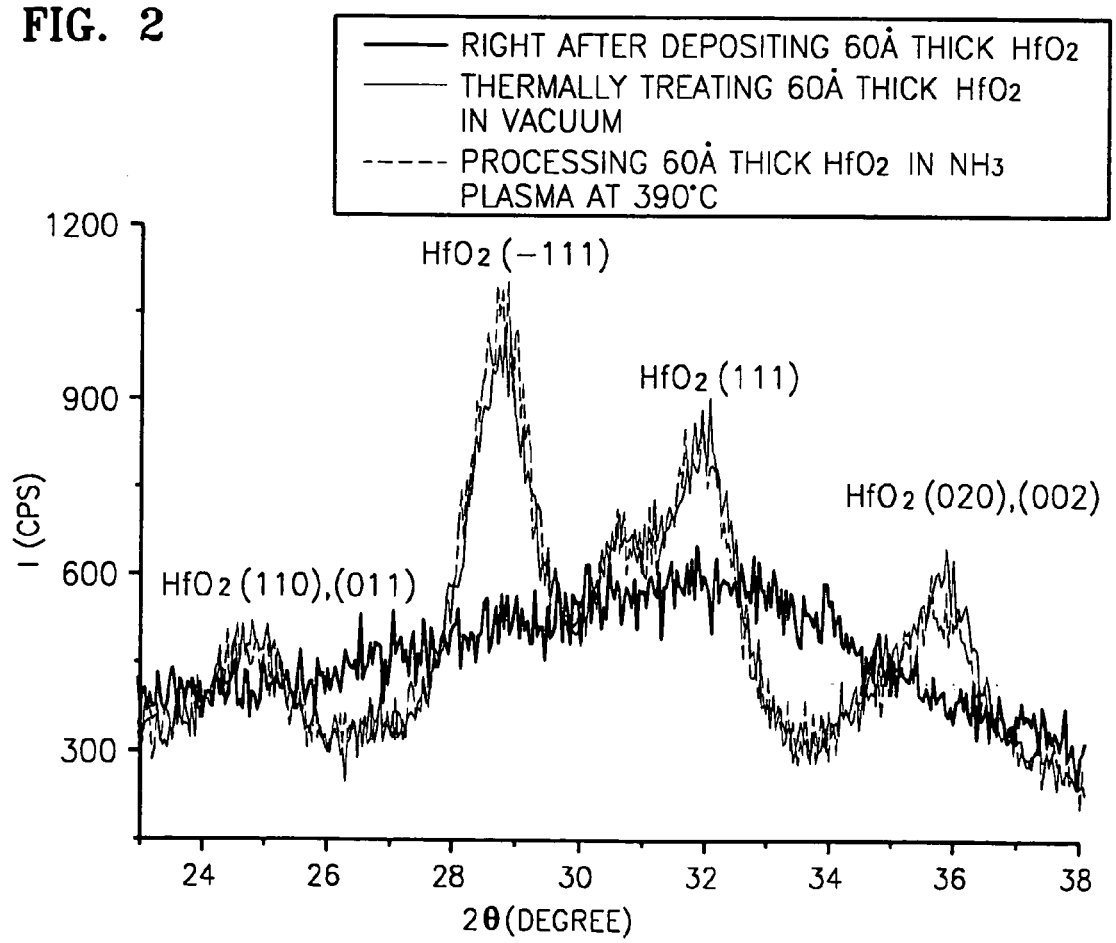
FIG. 2 is a graph showing X-ray Diffractometer (XRD) data, indicating whether an $HfO_2$ layer (processed in a plasma atmosphere) crystallization according to some embodiments of the invention.

FIG. 2 is a graph showing X-Ray Diffractometer (X-Ray) data, indicating whether or not an $HfO_2$ plasma processed layer according to embodiments of the invention is crystallized. To obtain the data shown in FIG. 2, a lower electrode was formed of TiN, and a 60 Angstrom thick layer of $HfO_2$ was formed thereon and then processed in an $NH_3$ plasma atmosphere at a temperature of about 390 degrees Centigrade. Also, as a comparative example, an $HfO_2$ layer was formed on a TiN lower electrode and then thermally treated in vacuum environment at a temperature of 650 degrees Centigrade. FIG. 2 shows XRD analysis data obtained from both cases.

As shown in FIG. 2, when the $HfO_2$ layer was processed in a plasma atmosphere at a relatively low temperature of about 390 degrees Centigrade according to embodiments of the invention, the $HfO_2$ layer was crystallized to a degree similar to that achieved using a high-temperature thermal process.

Figure 3A:
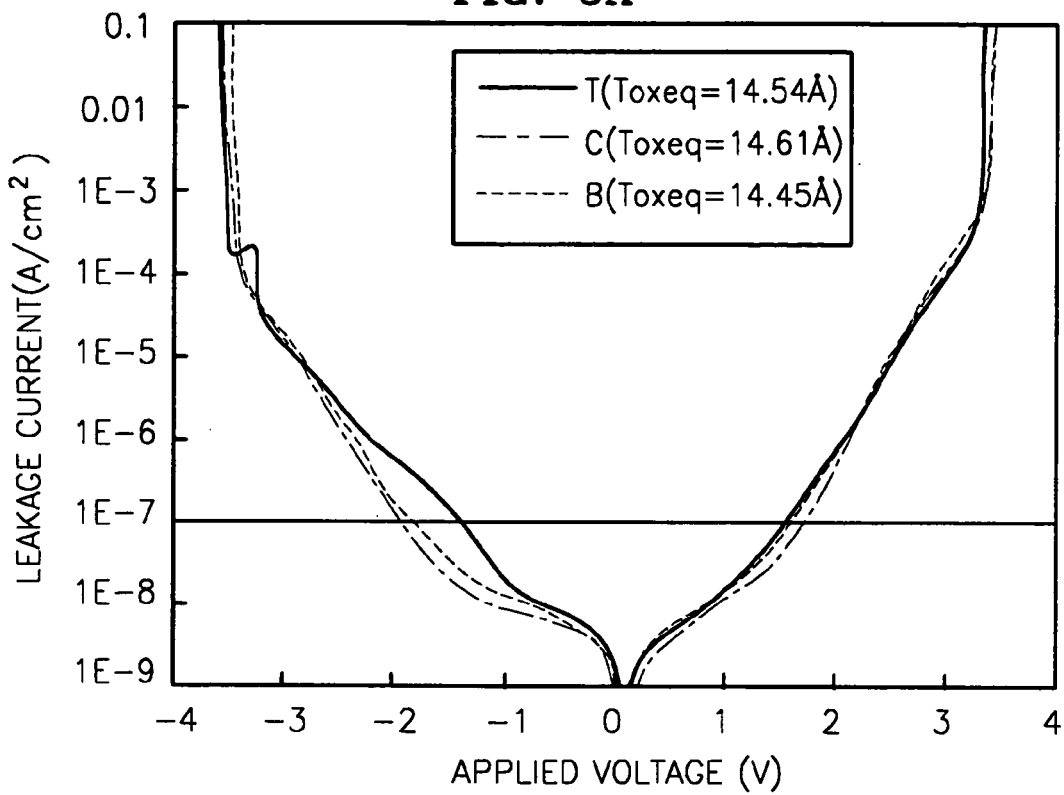
FIGS. 3A and 3B are graphs showing the leakage current characteristics of capacitor formed according to some embodiments of the invention.
Figure 3B:
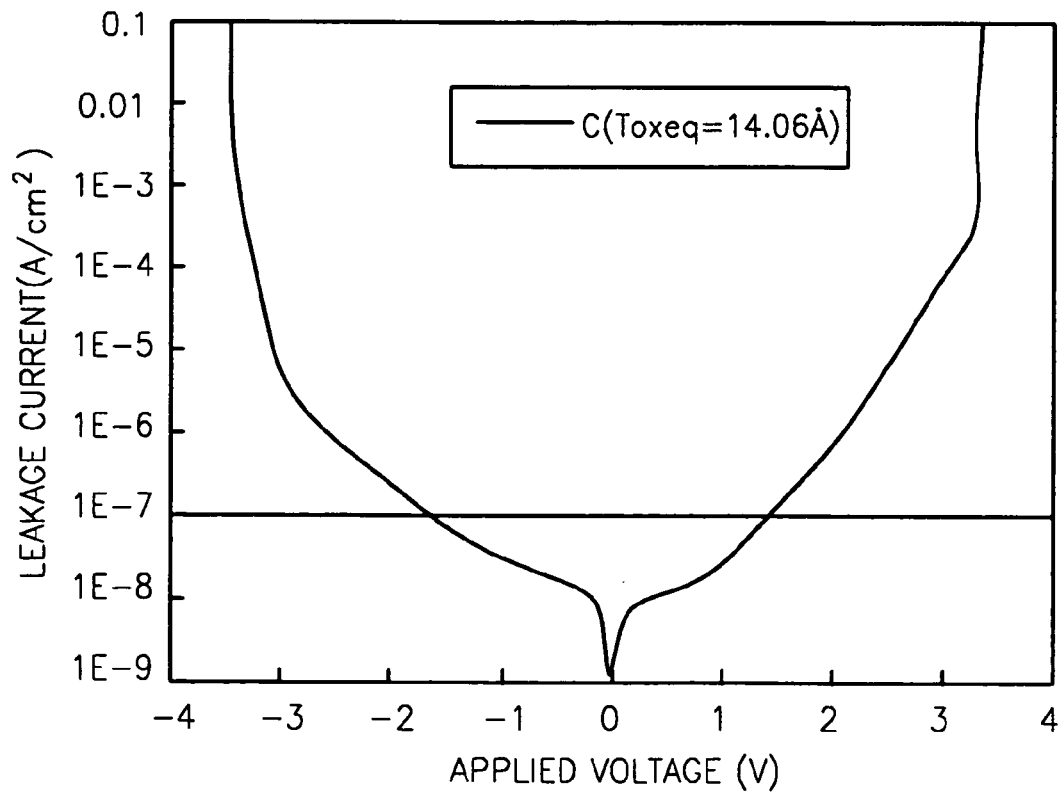

FIGS. 3A and 3B are graphs showing leakage current characteristics of capacitors, in which an $HfO_2$ layer is formed on a TiN lower electrode and then processed in a plasma atmosphere at a low temperature according to embodiments of the invention. Specifically, in FIG. 3A, the $HfO_2$ layer was formed on the TiN lower electrode and then crystallized using $NH_3$-plasma processing performed at a temperature of 390 degrees Centigrade. Then, a capacitor was formed with a TiN upper electrode thereon. In FIG. 3B, a capacitor was formed as in FIG. 3A except that a $HfO_2$ layer was crystallized by $N_2O$ plasma processing. In contrast, in FIG. 3C, a capacitor was formed as in FIG. 3A except that after an $HfO_2$ layer was formed, no processing was applied to the $HfO_2$ layer.

Figure 3C:
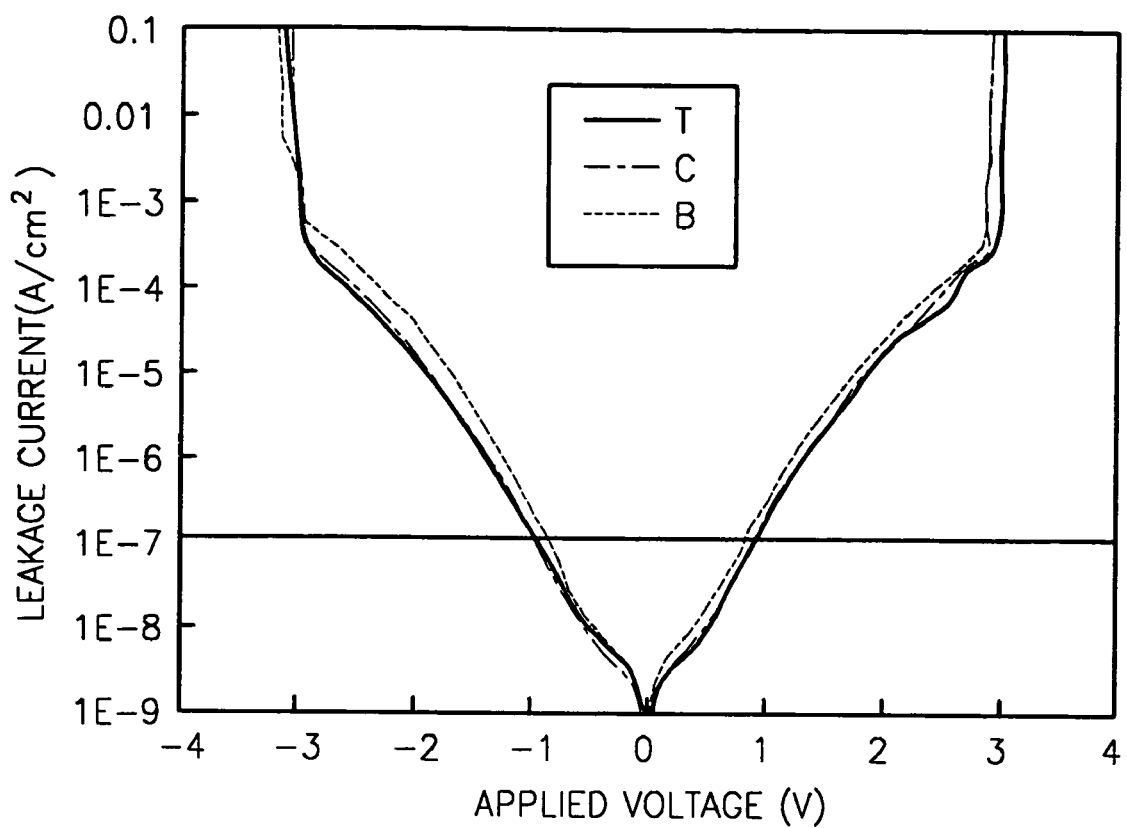
FIG. 3C is a graph showing leakage current characteristics of capacitors formed according to a conventional method.

In FIGS. 3A, 3B, and 3C, "T," "C," and "B" each refer to a position on a test target wafer, where leakage current was measured. That is, "T" refers to the top of the wafer, "C" refers to the center of the wafer, and "B" refers to the bottom of the wafer. Also, in FIGS. 3A and 3B, "Toxeq" refers to equivalent oxide thickness. As shown in FIGS. 3A, 3B, and 3C, when the $HfO_2$ layer was processed in a plasma atmosphere containing N gas, the leakage current was measured to decrease.

In some embodiments according to the invention, an $HfO_2$ layer is formed and crystallized by low-temperature plasma processing to form a dielectric layer of a MIM type capacitor. A low-temperature process may enable the upper electrode to be formed without seriously degrading a lower structure (such as a lower electrode formed of a material that may be otherwise susceptible to high-temperature processing). Also, by using low-temperature plasma processing, the leakage current of the capacitor using the $HfO_2$ dielectric layer may be reduced, thereby improving electrical characteristics. Further, if an upper electrode is formed using a Cl-containing source, the dielectric characteristics of the $HfO_2$ dielectric layer may remain adequate so that the leakage current characteristics may be acceptable, whereas the capacitance can be provided to the level needed to provide a functional memory cell.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed is:

1. A method of forming a metal-insulator-metal type capacitor structure in an integrated circuit memory device, comprising:

crystallizing an HfO$_2$ dielectric layer on a lower electrode of a capacitor structure in a low temperature plasma treatment at a temperature in a range between about 250 degrees Centigrade and about 450 degrees Centigrade; and forming an upper electrode on the HfO$_2$ dielectric layer, wherein forming an upper electrode comprises forming the upper electrode using a metal source containing halogen or an organometallic compound, or a combination thereof.

2. A method according to claim 1 wherein crystallizing an HfO$_2$ dielectric layer further comprises:

crystallizing the HfO$_2$ dielectric layer in a range between about 350 degrees Centigrade and about 450 degrees Centigrade.

3. A method according to claim 1 wherein forming the upper electrode using a metal source further comprises forming the upper electrode using a metal source containing Cl.

4. A method according to claim 1 wherein crystallizing an HfO$_2$ dielectric layer further comprises:

crystallizing the HfO$_2$ dielectric layer in the low temperature plasma atmosphere including an N gas.

5. A method according to claim 4 wherein crystallizing an HfO$_2$ dielectric layer further comprises:

crystallizing the HfO$_2$ dielectric layer in the low temperature plasma atmosphere including NH$_3$ gas or N$_2$O gas or N$_2$ gas or combinations thereof.

6. A method of forming a metal-insulator-metal type capacitor structure in an integrated circuit memory device, comprising:

forming a lower electrode on a substrate;

forming an HfO$_2$ dielectric layer on the lower electrode;

processing the HfO$_2$ dielectric layer in a plasma atmosphere at a temperature in a range between about 250 degrees Centigrade and about 450 degrees Centigrade; and forming an upper electrode on the HfO$_2$ dielectric layer, wherein the upper electrode is formed using a halogen-containing metal source or an organometallic compound source or a combination thereof.

7. A method according to claim 6 wherein the lower electrode is formed of a metal nitride or a noble metal or combinations thereof.

8. A method according to claim 7 wherein the lower electrode is formed of TiN or TaN or WN or Ru or Ir or Pt or combinations thereof.

9. A method according to claim 6 wherein the HfO$_2$ dielectric layer is formed using atomic layer deposition or chemical vapor deposition or physical vapor deposition or metal-organic chemical vapor deposition.

10. A method according to claim 6 wherein processing the HfO$_2$ dielectric layer in a plasma atmosphere is performed using plasma of N-containing gas.

11. A method according to claim 10 wherein the N-containing gas includes NH$_3$ or N$_2$O or N$_2$ or combinations thereof.

12. A method according to claim 6 wherein the upper electrode is formed of a metal nitride or a noble metal or combinations thereof.

13. A method according to claim 12 wherein the upper electrode is formed of TiN or TaN or WN or Ru or Ir or Pt, or combinations thereof.

14. A method according to claim 6 wherein the plasma atmosphere is maintained at a temperature in a range between about 250 degrees Centigrade and about 450 degrees Centigrade.

15. A method of forming a metal-insulator-metal type capacitor in an integrated circuit memory device, comprising:

forming a buried contact plug in a first interlayer dielectric layer on a substrate;

forming a first silicon nitride layer and a second interlayer dielectric layer on the buried contact plug;

forming a buffer buried contact plug in the first silicon nitride layer and in the second interlayer dielectric layer to contact the buried contact plug;

sequentially forming a high density plasma layer, a second silicon nitride layer, a protection layer, and an insulating layer on the buffer buried contact plug to form a cover layer;

removing a portion of the cover layer to form a hole to expose at least a portion of the buffer buried contact plug;

forming a conductive layer in the hole and outside the hole on the insulating layer using a Cl source metal;

forming a sacrificial layer on the conductive layer inside and outside the hole;

removing a portion of the sacrificial layer outside the hole to expose the insulating layer;

removing the insulating layer from around the conductive layer to form a lower electrode for the capacitor;

forming an amorphous HfO$_2$ dielectric layer on the lower electrode;

crystallizing the amorphous HfO$_2$ dielectric layer on the lower electrode in a low temperature plasma atmosphere including NH$_3$ gas or N$_2$O gas or N$_2$ gas or combinations thereof in a temperature range between about 350 degrees Centigrade and about 450 degrees Centigrade to provide a crystallized HfO$_2$ dielectric layer; and forming an upper electrode on the crystallized HfO$_2$ dielectric layer using a halogen-containing metal source or an organometallic compound source or a combination thereof.

* * * * *